United States Patent
Tam et al.

(10) Patent No.: US 9,041,019 B2
(45) Date of Patent: May 26, 2015

(54) METHOD OF AND DEVICE FOR MANUFACTURING LED ASSEMBLY USING LIQUID MOLDING TECHNOLOGIES

(71) Applicant: Flextronics AP, LLC, Broomfield, CO (US)

(72) Inventors: Samuel Tam, Daly City, CA (US); Murad Kurwa, San Jose, CA (US); Dick Pang, Tsuen Wan (CN)

(73) Assignee: Flextronics AP, LLC, Broomfield, CO (US)

(*) Notice: Subject to any disclaimer, the term of this patent is extended or adjusted under 35 U.S.C. 154(b) by 0 days.

(21) Appl. No.: 13/660,893

(22) Filed: Oct. 25, 2012

(65) Prior Publication Data

US 2014/0117384 A1  May 1, 2014

(51) Int. Cl.

| | |
|---|---|
| H01L 29/18 | (2006.01) |
| H01L 33/00 | (2010.01) |
| H01L 27/15 | (2006.01) |
| H01L 29/267 | (2006.01) |
| H01L 31/12 | (2006.01) |
| H01L 21/00 | (2006.01) |
| H01L 25/075 | (2006.01) |
| H01L 23/44 | (2006.01) |
| H01L 33/50 | (2010.01) |
| H01L 33/52 | (2010.01) |

(52) U.S. Cl.
CPC ............ *H01L 33/005* (2013.01); *H01L 25/0753* (2013.01); *H01L 23/44* (2013.01); *H01L 33/50* (2013.01); *H01L 33/52* (2013.01)

(58) Field of Classification Search
CPC ...... H01L 23/44; H01L 25/0753; H01L 33/005; H01L 33/50; H01L 33/52
USPC ................................. 257/79–103; 438/22–47
See application file for complete search history.

(56) References Cited

U.S. PATENT DOCUMENTS

| | | | |
|---|---|---|---|
| RE36,414 E | 11/1999 | Tickner | |
| 6,274,890 B1 * | 8/2001 | Oshio et al. | 257/98 |
| 6,882,111 B2 | 4/2005 | Kan et al. | |
| 7,259,403 B2 * | 8/2007 | Shimizu et al. | 257/99 |
| 8,227,269 B2 * | 7/2012 | Chen et al. | 438/26 |
| 8,228,261 B2 | 7/2012 | Callegari | |
| 2001/0042865 A1 * | 11/2001 | Oshio et al. | 257/100 |
| 2006/0186430 A1 * | 8/2006 | Park et al. | 257/100 |
| 2008/0048200 A1 * | 2/2008 | Mueller et al. | 257/98 |
| 2009/0179207 A1 * | 7/2009 | Chitnis et al. | 257/88 |
| 2010/0079642 A1 * | 4/2010 | Kurimoto et al. | 348/294 |
| 2010/0295070 A1 * | 11/2010 | Su et al. | 257/91 |
| 2010/0295077 A1 * | 11/2010 | Melman | 257/98 |
| 2011/0018017 A1 * | 1/2011 | Bierhuizen et al. | 257/98 |
| 2012/0052607 A1 * | 3/2012 | Yamaguchi | 438/27 |
| 2012/0097985 A1 * | 4/2012 | Liu et al. | 257/88 |
| 2012/0205697 A1 * | 8/2012 | Kim et al. | 257/98 |
| 2013/0050998 A1 | 2/2013 | Chu et al. | |
| 2013/0051001 A1 | 2/2013 | Muskin | |
| 2013/0135866 A1 | 5/2013 | Souvay et al. | |
| 2013/0182425 A1 | 7/2013 | Seki et al. | |

* cited by examiner

*Primary Examiner* — Karen Kusumakar
(74) *Attorney, Agent, or Firm* — Haverstock & Owens LLP

(57) ABSTRACT

A method of and a system for making LED comprising concurrently forming multiple dam structures on a whole silicon wafer using a liquid transfer mold, attaching dies to the silicon wafer inside each of the dam structure, performing flux reflow, cleaning flux, performing wire bonding, dispensing phosphor, curing the phosphor, concurrently forming dome structures by using a liquid transfer mold on all of the dam structures, mounting wafer, and using a saw for single or multiple LED(s) singulation.

15 Claims, 8 Drawing Sheets

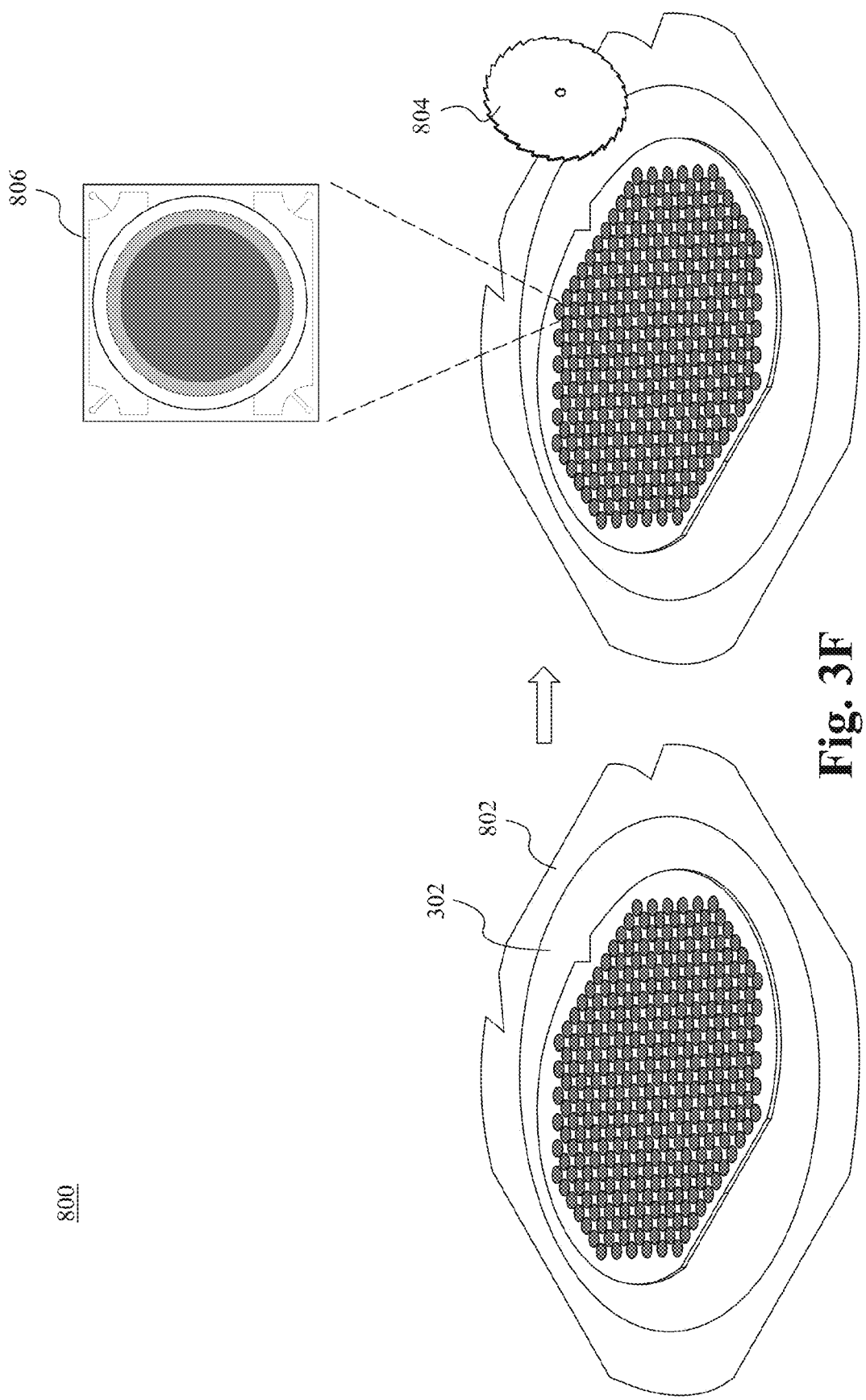

US 9,041,019 B2

METHOD OF AND DEVICE FOR MANUFACTURING LED ASSEMBLY USING LIQUID MOLDING TECHNOLOGIES

FIELD OF THE INVENTION

The present invention relates to electronic device assembly. More particularly, the present invention relates to LED assembly.

BACKGROUND

A typical LED assembling process performs dam attachment or dispensing dam epoxy adhesive followed by curing and dome formation on a single silicon chip that is singulated from a whole silicon wafer. Since the process has to be repeatedly performed on every chip, such process results in a high manufacturing/assembling cost, slow throughput, a low yield, and low placement accuracy. As a result, more machines are needed in the process and more inspection and control steps are involved in the typical LED assembling process.

A typical LED assembling process is described in the following. FIG. 1 shows a process flow 100 of the typical LED assembling process. At a Step 102, a singulated silicon panel is formed from a whole silicon wafer. At a Step 104, a die is attached to the singulated silicon panel. At a Step 106, flux reflow is performed. At a Step 108, flux cleaning is performed. At a Step 110, wire bonding is performed. At a Step 112, a dam is attached to the substrate or dispensing dam epoxy. At a Step 114, the process of dam curing is performed. At a Step 116, phosphor is dispensed into the dam. At a Step 118, the phosphor that is dispensed into the dam is cured. Subsequently domes are formed to encapsulate the LED components. At a Step 120, materials for the dome formation are dispensed. At a Step 122, the step of dome curing is performed. At a Step 124, strip panels with LED units are mounted onto the substrate. At a Step 126, saw singulation to make singular chips are performed.

SUMMARY OF THE INVENTION

Methods of and devices for improving the LED assembling process are disclosed. In some embodiments, liquid molding technologies (simultaneously forming multiple dams and domes) are used to replace the single dam attachment and single dome dispensing step in the typical LED assembling process. In some embodiments, a whole silicon wafer is used in the assembling process, instead of a small silicon panel used in the typical LED assembling process.

In an aspect, a method of making LEDS comprises forming multiple dam structures on a silicon wafer, coupling multiple dies on the silicon wafer, adding phosphor to one or more of the multiple dam structures, curing the phosphor, and encapsulating the phosphor. In some embodiments, the silicon wafer comprises a whole silicon wafer (e.g., an undivided slice of the wafer). In other embodiments, the method comprises using a liquid molding. In some other embodiments, the step of forming multiple dam structures comprises using a liquid molding. In some embodiments, the step of encapsulating the phosphor comprises using a liquid molding. In other embodiments, the step of encapsulating the phosphor comprises forming one or more dome structures on the at lease one of the dam structures. In some other embodiments, the method further comprises singulating after the step of encapsulating the phosphor. In some embodiments, the method comprises concurrently forming multiple dam structures on the silicon wafer. In other embodiments, the method further comprises concurrently forming multiple dome structures on the silicon wafer. In some embodiments, the method further comprises cutting the silicon wafer into one or more strips after the forming of the multiple dam structures.

In another aspect, a lighting device comprises an array of LED units on a silicon wafer, a dam structure on each of the LED units, phosphor contained in the dam structure, and a cover covering the dam structure. In some embodiments, the silicon wafer comprises a whole piece of silicon wafer. In other embodiments, the array comprises at least 20 LED units. In some other embodiments, the cover comprises a dome structure. In some embodiments, the cover encapsulates the phosphor. In other embodiments, the silicon wafer is enclosed by a liquid transferring mold.

In another aspect, a method of making LEDS comprises forming an array of a plurality of dam structures concurrently on a silicon wafer using a liquid transferring mold, coupling one or more of LED dies to the dam structures, coupling wires to the LED dies, adding phosphor to be contained within the dam structure, and forming dome structure concurrently on each of the dam structures using a liquid transferring mold. In some embodiments, the method further comprises singulating. In other embodiments, the step of singulating is performed by a saw. In some other embodiments, the method further comprises forming an array of multiple LED light units on the silicon wafer. In some embodiments, the silicon wafer comprises a whole silicon wafer.

In another aspect, a method of making LED comprises forming multiple dam structures concurrently on a whole silicon wafer using a first liquid molding, attaching at least one die to each of the multiple dam structure, performing flux reflow, performing flux cleaning, performing wire bonding, dispensing phosphor after wire bonding, curing the phosphor dispensed, forming a dome structure on each of the multiple dam structures using a second liquid transferring molding, mounting the whole silicon wafer, and sigulating by a saw.

Other features and advantages of the present invention will become apparent after reviewing the detailed description of the embodiments set forth below.

BRIEF DESCRIPTION OF THE DRAWINGS

The accompanying drawings, which are incorporated in and form a part of this specification, illustrate embodiments of the invention and, together with the description, serve to explain the principles of the invention, but not limit the invention to the disclosed examples.

FIGS. 3A-3F show parts of a LED assembling process according to some embodiments of the present invention.

FIG. 3A illustrates a dam forming process according to some embodiments of the present invention.

FIG. 3B illustrates a die attaching process of according to some embodiments of the present invention.

FIG. 3C illustrates a wire bonding process according to some embodiments of the present invention.

FIG. 3D illustrates a phosphor dispensing process according to some embodiments of the present invention.

FIG. 3E illustrates a dome forming process according to some embodiments of the present invention.

FIG. 3F illustrates a singulating process according to some embodiments of the present invention.

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Reference will now be made in detail to the embodiments of the LED assembling method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Methods of and devices for improving the LED assembling process are disclosed. In some embodiments, liquid molding technologies are used to replace the single dam attachment and single dome dispensing in the typical LED assembling process, such that it provides a lower assembly manufacturing cost, a higher productivity with a better yield in the LED light chips assembling process.

Figure 1:
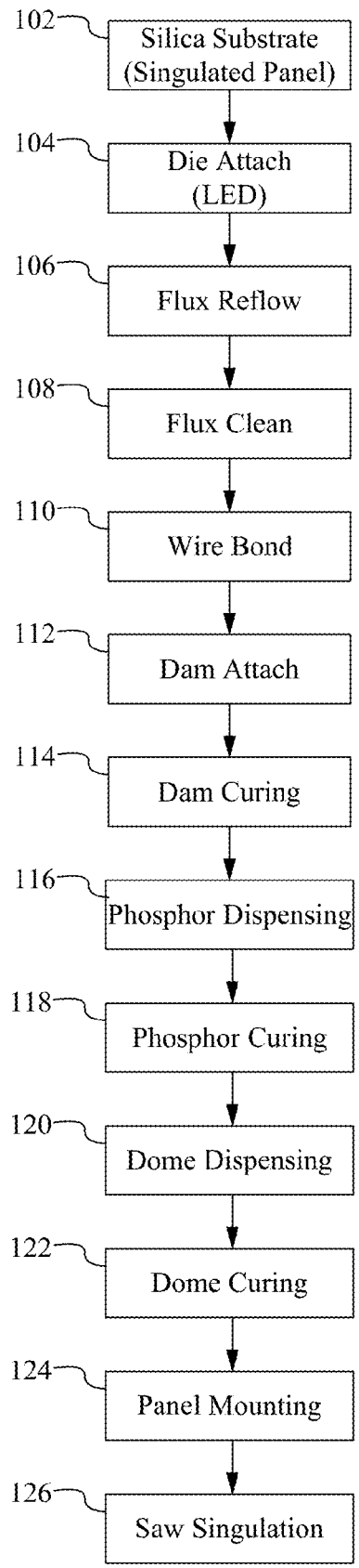
FIG. 1 is a flow chart illustrating a typical LED assembling process.
Figure 2:
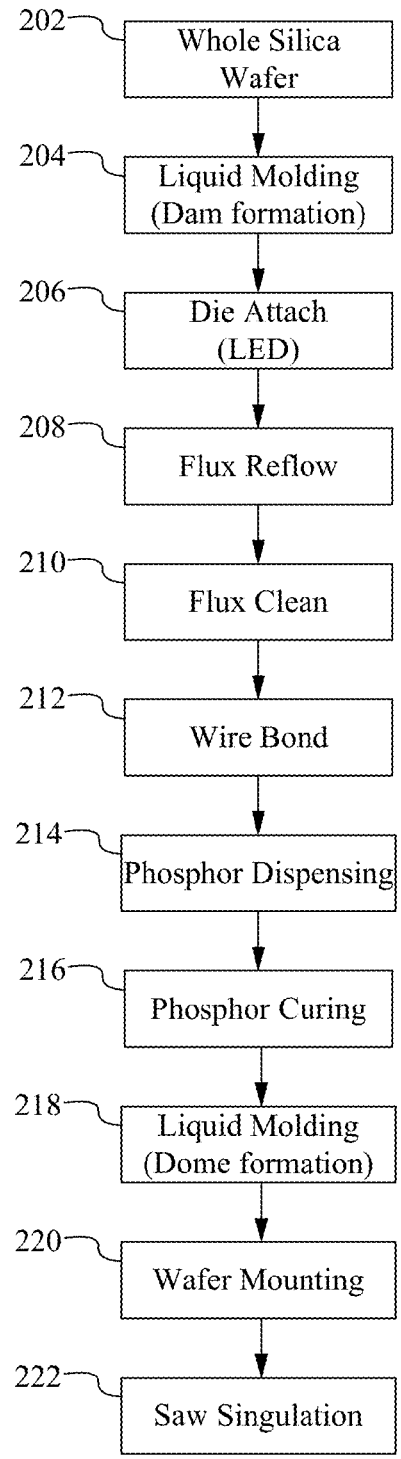
FIG. 2 is a flow chart illustrating a LED assembling process according to some embodiments of the present invention.

In the following, FIG. 2 is a flow chart illustrating a LED assembling process 200 according to some embodiments of the present invention. At a Step 202, a whole silicon wafer is prepared. The whole silicon wafer can be prepared from a typical process that makes, for example, a single crystalline silicon wafer. At a Step 204, a liquid molding is used to form dams on the whole silicon wafer. At a Step 206, one or more dies are attached inside the dam to the substrate. At a Step 208, a step of flux reflow is performed. At a Step 210, the flux is cleaned from the wafer. At a Step 212, wires are bonded to the substrate. At a Step 214, phosphor is dispensed into the dam. At a Step 216, the phosphor dispensed is cured. At a Step 218, the process of liquid molding is performed to make each of the dam structures to be encapsulated becoming a dome structure. At a Step 220, the whole silicon wafer is mounted for a saw singulation process. At a Step 222, the saw singulation process is performed to make sigulated single LED chips/units. In the following, apparatuses that can be used to implement the process 200 are illustrated below.

Figure 3A:
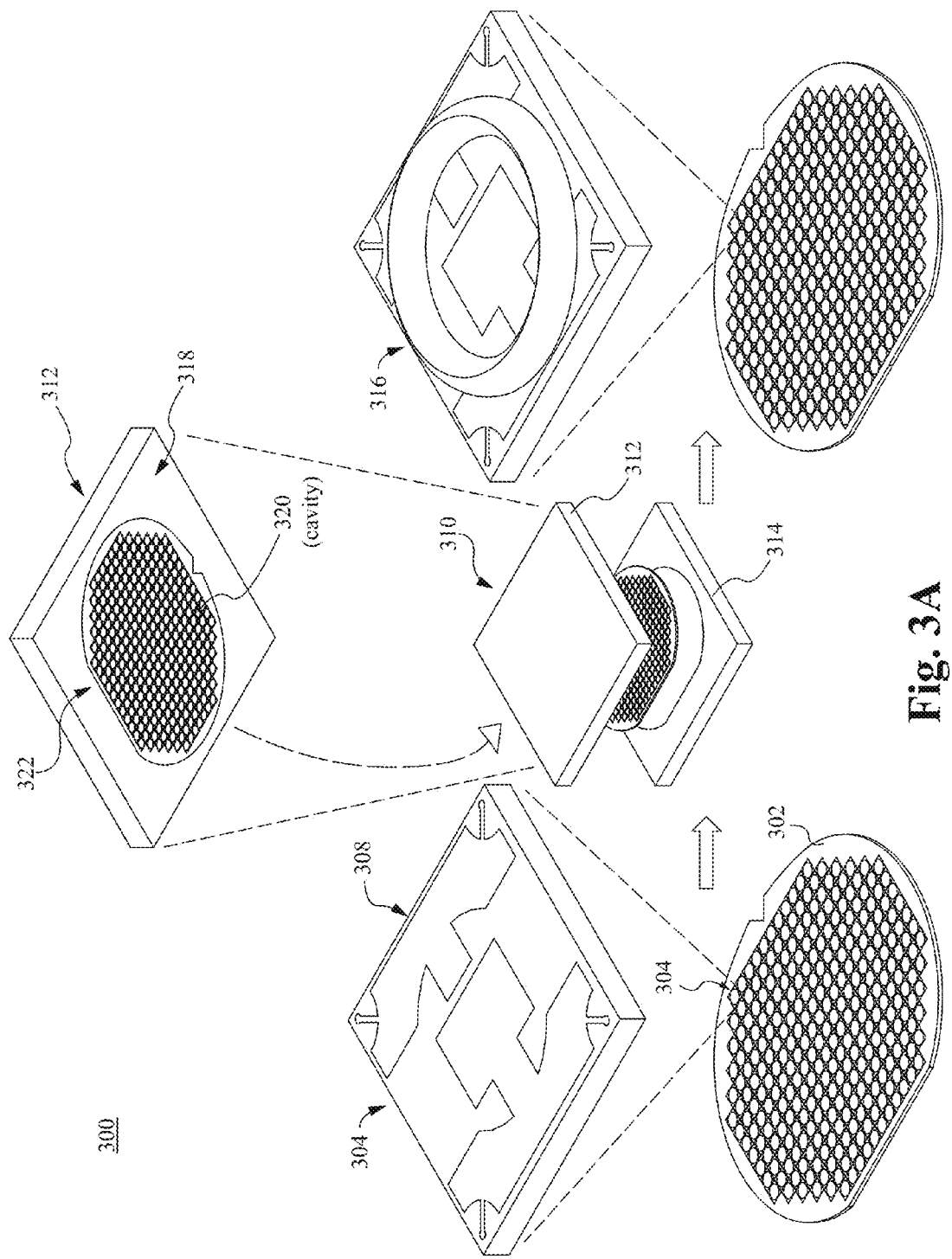

FIGS. 3A-3F show a LED assembling process 300 according to some embodiments of the present invention. Referring to FIG. 3A, a dam forming process is shown according to some embodiments of the present invention. The process 300 is able to start from preparing a substrate 302, such as a silicon substrate or a silicon wafer. The substrate 302 comprises one or more units of LED cells 304. The unit cells 304 are able to be arranged on the substrate in an array to maximize the number of cells on the substrate 304. A person of ordinary skill in the art appreciates that any other patterns and arrangements of the cells are applicable. Electrodes 308 are patterned on the substrate 302. The electrodes 308 can comprise connectors that can be used to couple with an electrical power source to provide a voltage bias making the LED (Light Emitting Diode) to emit light. One of the dam structures 316 can be formed on each of the unit cells 314 as a side wall for containing/confining phosphors that is dispensed in a subsequent stage. A person of ordinary skill in the art appreciates that the shape, the height, and the thickness of the wall of the dams are variable. In some embodiments, the inside parts of the wall of the dam structures 316 forms a bowl structure with a flat bottom side. The dam structures 316 are able to be formed on each of the unit cells 304.

In some embodiments, the dam structures 316 are able to be formed using a liquid transferring mold 310. The liquid transferring mold can comprise a top mold 312 and a bottom mold 314. The top mold 312 and the bottom mold 314 are able to be pressed against each other using the inner structure of the mold complimentary to the dam structures to concurrently form the multiple dam structures 316. The bottom mold 314 is able to have a cavity or hole for snug fitting the substrate wafer 302. The top mold 312 is able to contain a mold structure capable of shaping and forming the multiple dam structures 316. A surface 318 (the bottom side of the top plate 312) comprises a pattern 322 that is able to concurrently form multiple dam structures 316.

Figure 3B:
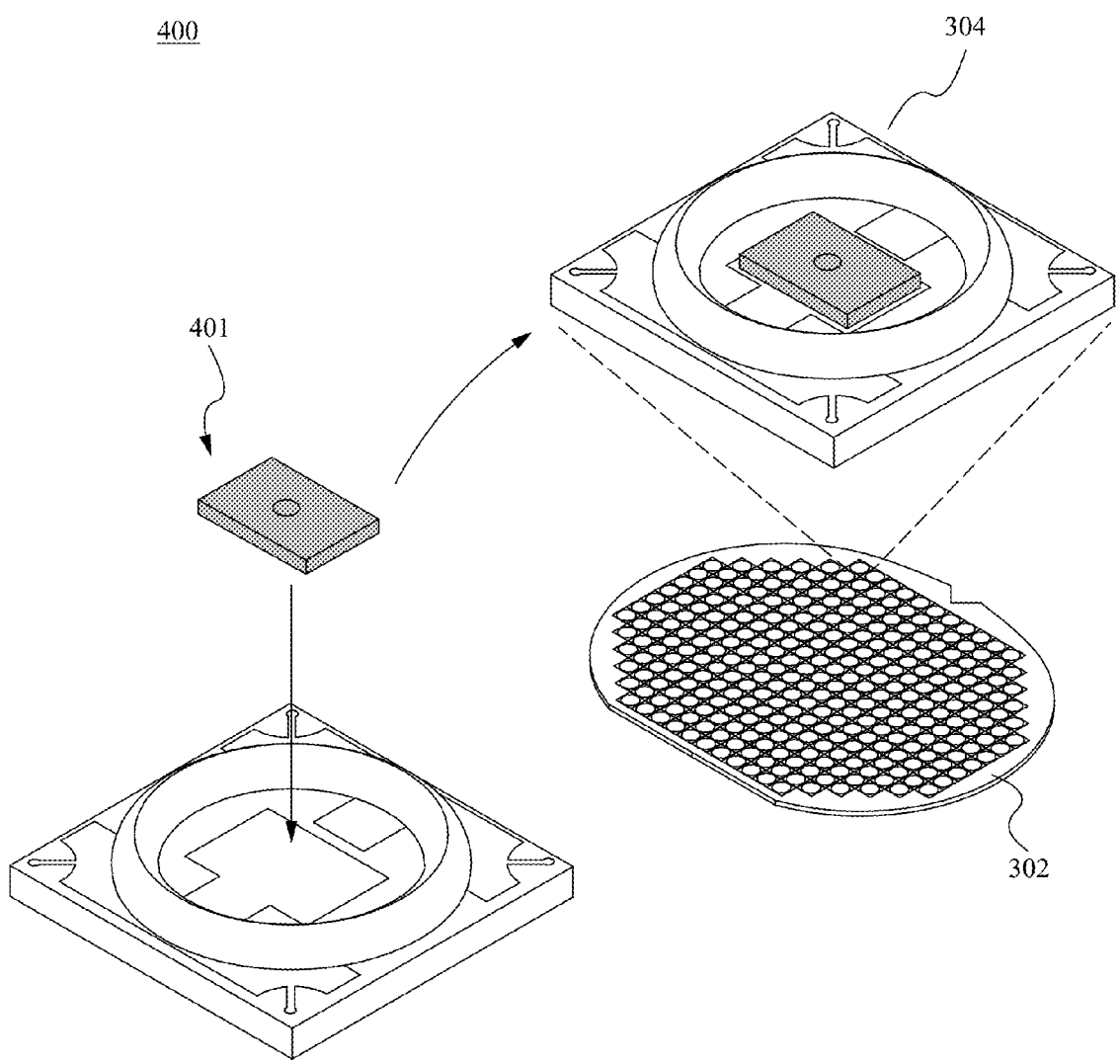

Referring to FIG. 3B, a die attaching process 400 is described according to some embodiments of the present invention. A LED bin 401 is attached to the cell unit 304 on a selected location on the substrate wafer 302. In some embodiments, the die attachment is able to be performed by using an adhesive die attaching process. In some other embodiments, the die attachment is able to be performed by using an eutectic attachment process.

Figure 3C:
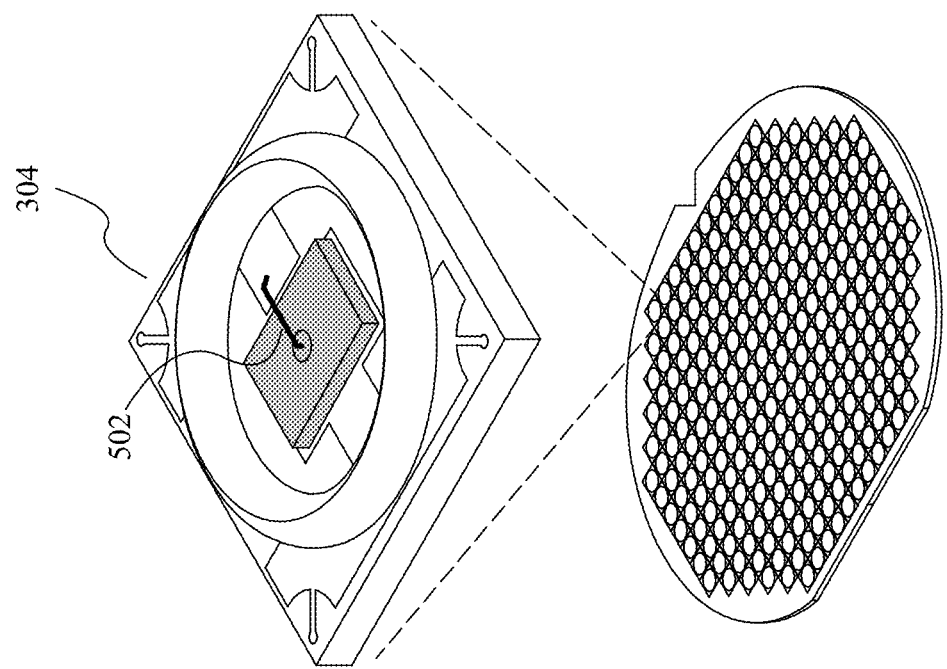
Figure 3C:
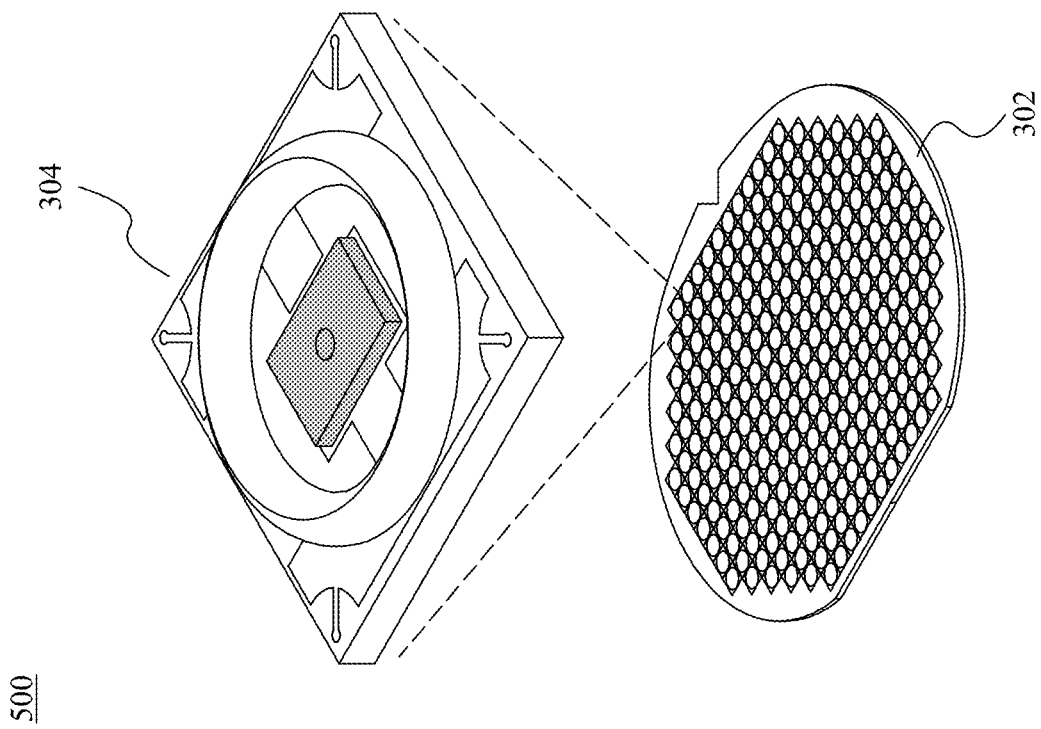

Referring to FIG. 3C, a wire bonding process 500 is described in accordance with some embodiments of the present invention. In some embodiments, a gold wire 502 is used to bond the LED die to the substrate wafer 302 on each of the unit cell 304. In some embodiments, the wire bonding can be performed using a typical wire bonding process known by a person of ordinary skill in the art.

Figure 3D:
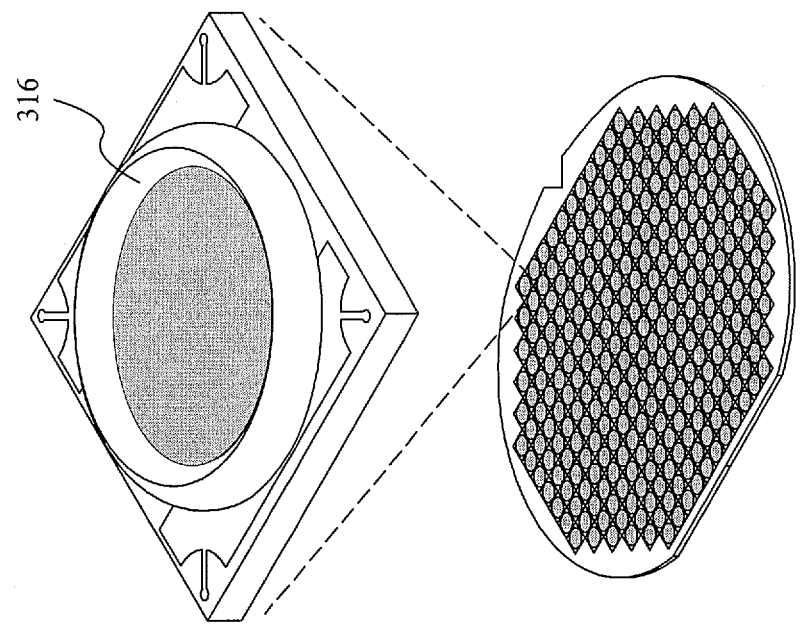
Figure 3D:
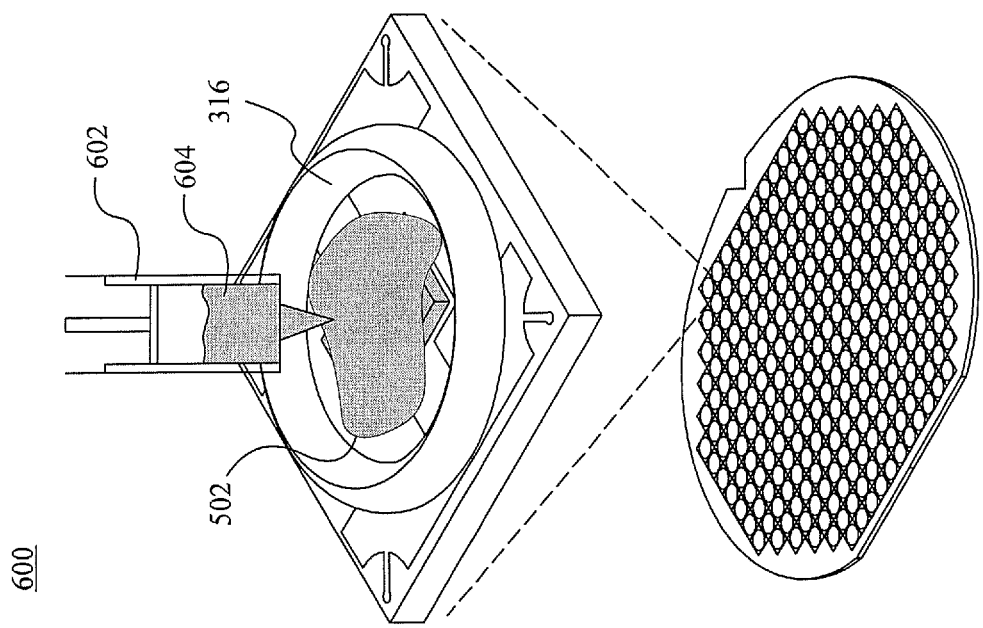

Referring to FIG. 3D, a phosphor dispensing process 600 is described in accordance with some embodiments of the present invention. Phosphor 604 is dispensed through a phosphor dispensing device 602. The phosphor 604 that is dispensed in the dam structure 316 is able to be confined within the dam structure 316.

Figure 3E:
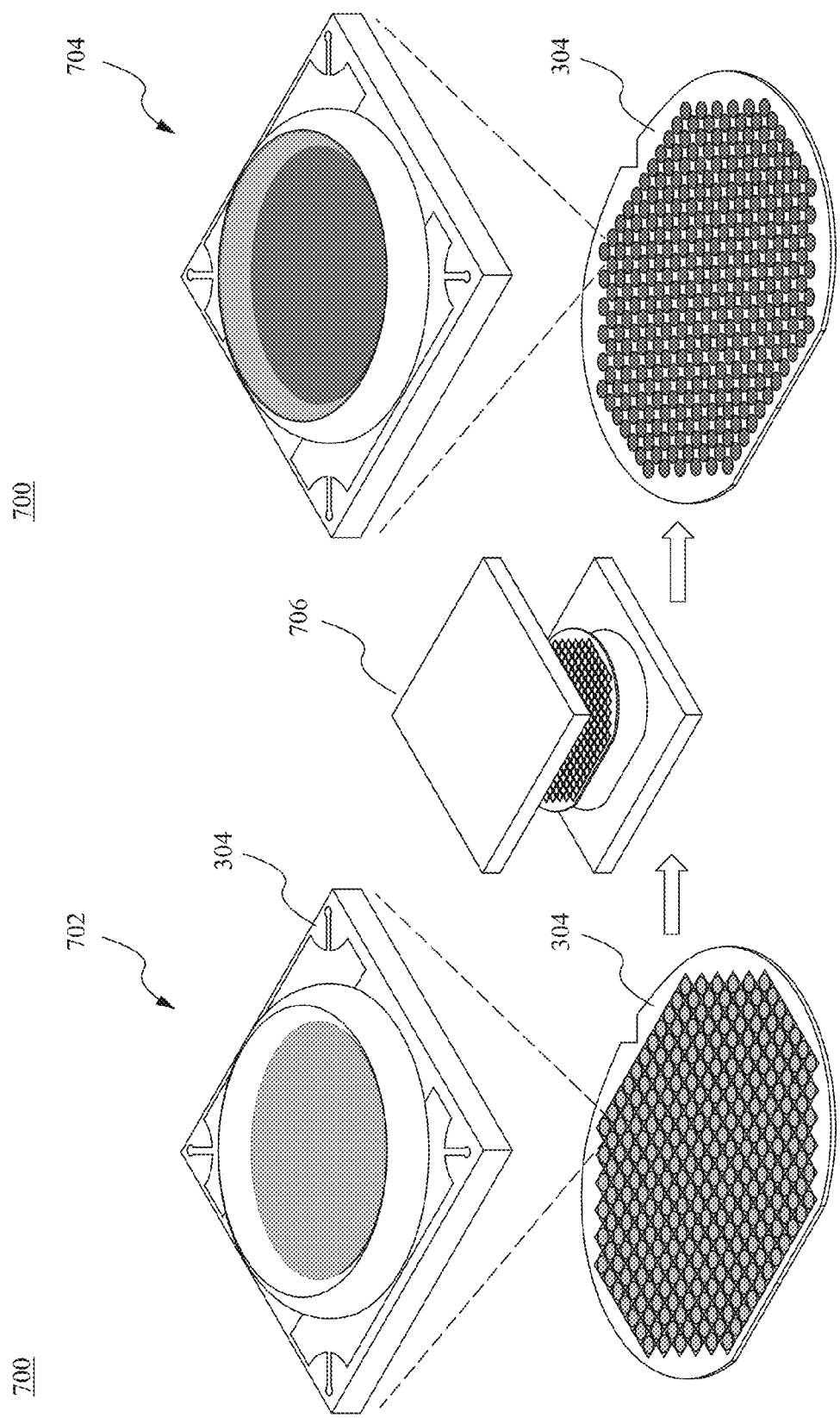

Referring to FIG. 3E, a dome formation process 700 is described in accordance with some embodiments of the present invention. After the phosphor is dispensed, a dome 704 is formed to encapsulate the structure 702 containing the phosphor that is dispensed in the dam structure. The dome 704 formation process 700 is able to be performed using a liquid transfer molding 706.

Referring to FIG. 3F, a singulation process 800 is described in accordance with some embodiments of the present invention. The substrate wafer 302 with LEDs assembled is mounted on a table 802 to be cut by a cutting device 804, such as a saw. After the singulation process 800, single units of LED 806 are formed.

The LED assembling processes and devices disclosed herein have many advantageous aspects over the typical LED assembling process. For example, the assembling process that is performed on the whole silicon wafer, disclosed herein, is a more efficient process than the typical process that is performed in a small panel form. Further, the liquid transfer molding process disclosed herein can enhance the accuracy of dam and dome placement, such that the components of the LED assembling using the method disclosed herein have better adhesion to the silicon substrate. The rate of production (unit per hour, UPH) is increased four times in some testings when comparing with the typical process that uses a single dam attaching and single dispensing process.

The liquid transferring molding used in the presently disclosed process also provides many advantageous aspects. For example, the liquid transferring molding process disclosed herein is capable of concurrently making multiple/arrays of dams and domes on the silicon wafer, which can have high dimension accuracy and precision. In some embodiments, the placement and dimension accuracy using the process disclosed herein can be within the range of ±10 micrometers. In contrast, the accuracy and precision can only be in the ±250 micrometer range in a typical LED assembling process. Additionally, with the use of the liquid molding process, many unneeded assembling process steps are able to be eliminated. The fully utilization of the wafer and machine has many advantageous aspects. For example, a lower assembling cost is attainable.

The process and devices described herein can be utilized in making LED and semiconductor devices. In operation, the process is able to make the manufacturing/assembling process in a batch mode, such that the repetition of the manufacturing process on each single LED can be eliminated.

The present invention has been described in terms of specific embodiments incorporating details to facilitate the understanding of the principles of construction and operation of the invention. The specific configurations shown in relation to the various modules and the interconnections therebetween are for exemplary purposes only. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A method of making a LED assembly comprising:
   a. forming multiple dam structures on a whole silicon wafer using a liquid transfer mold, wherein the liquid transfer mold comprises a top mold and a bottom mold configured to press against each other and using an inner structure of the mold complimentary to the dam structures to concurrently form the multiple dam structures;
   b. coupling multiple LED dies on the silicon wafer within each of the dam structures;
   c. adding phosphor to an area enclosed by the multiple dam structures;
   d. curing the phosphor; and
   e. encapsulating the phosphor.

2. The method of claim 1, further comprising using a liquid molding mold.

3. The method of claim 1, wherein the forming multiple dam structures comprises using a liquid molding mold.

4. The method of claim 1, wherein the encapsulating the phosphor comprises using a liquid molding mold.

5. The method of claim 1, wherein the encapsulating the phosphor comprises forming one or more dome structures on the multiple dam structures.

6. The method of claim 1, further comprising singulating after the encapsulating the phosphor.

7. The method of claim 1, further comprising concurrently forming the multiple dam structures on the silicon wafer.

8. The method of claim 1, further comprising concurrently forming multiple dome structures on the silicon wafer.

9. The method of claim 1, further comprising cutting the silicon wafer into one or more strips after the forming multiple dam structures.

10. A method of making LED comprising:
    a. concurrently forming an array of plural dam structures on a silicon wafer using a liquid transfer mold, wherein the liquid transfer mold comprises a top mold and a bottom mold configured to press against each other and using an inner structure of the liquid transfer mold complimentary to the dam structures to concurrently form the multiple dam structures;
    b. coupling one or more of LED dies to the plurality of the dam structures;
    c. coupling wires to the LED dies;
    d. adding phosphor to be contained within the dam structure; and
    e. forming a dome structure on each of the dam structure using a liquid transfer mold.

11. The method of claim 10, further comprising singulating.

12. The method of claim 11, wherein the singulating is performed by a saw.

13. The method of claim 10, further comprising forming an array of multiple LED light units on the silicon wafer.

14. The method of claim 10, wherein the wires comprise gold wires.

15. A method of making LED comprising:
    a. concurrently forming multiple dam structures on a whole silicon wafer using a first liquid molding, wherein the first liquid molding comprises a top mold and a bottom mold configured to press against each other and using an inner structure of the first liquid molding complimentary to the dam structures to concurrently form the multiple dam structures;
    b. attaching at least one die to each of the multiple dam structure;
    c. performing flux reflow;
    d. performing flux cleaning;
    e. performing wire bonding;
    f. dispensing phosphor after wire bonding;
    g. curing the dispensed phosphor;
    h. concurrently forming a dome structure on each of the multiple dam structures using a second liquid molding;
    i. mounting the whole silicon wafer; and
    j. sigulating by a saw.

* * * * *